United States Patent
Fredrickson et al.

(10) Patent No.: US 11,515,151 B2
(45) Date of Patent: Nov. 29, 2022

(54) METHODS AND PRECURSORS FOR SELECTIVE DEPOSITION OF METAL FILMS

(71) Applicant: Applied Materials, Inc., Santa Clara, CA (US)

(72) Inventors: Kurt Fredrickson, Sunnyvale, CA (US); Atashi Basu, Menlo Park, CA (US); Mihaela Balseanu, Sunnyvale, CA (US); Ning Li, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 383 days.

(21) Appl. No.: 16/753,534

(22) PCT Filed: Oct. 5, 2018

(86) PCT No.: PCT/US2018/054736
§ 371 (c)(1),
(2) Date: Apr. 3, 2020

(87) PCT Pub. No.: WO2019/071215
PCT Pub. Date: Apr. 11, 2019

(65) Prior Publication Data
US 2020/0312653 A1   Oct. 1, 2020

Related U.S. Application Data

(60) Provisional application No. 62/569,240, filed on Oct. 6, 2017.

(51) Int. Cl.
*H01L 21/31* (2006.01)
*H01L 21/02* (2006.01)
(Continued)

(52) U.S. Cl.
CPC .......... *H01L 21/0228* (2013.01); *C23C 16/34* (2013.01); *C23C 16/40* (2013.01);
(Continued)

(58) Field of Classification Search
CPC ......... H01L 21/02181; H01L 21/02183; H01L 21/02186; H01L 21/02189;
(Continued)

(56) References Cited

U.S. PATENT DOCUMENTS

| 5,254,499 A | 10/1993 | Sandhu et al. |
| 2004/0026037 A1 | 2/2004 | Shinriki et al. |

(Continued)

FOREIGN PATENT DOCUMENTS

JP   2015074831 A   4/2015

OTHER PUBLICATIONS

Katz, A., et al., "Properties of titanium nitride thin films deposited by rapid-thermal-lowpressure-metalorganic-chemical-vapor-deposition technique using tetrakis (dimethylamido) titanium precursor", Journal of Applied Physics 70, 3666 (1991), 13 pages.

*Primary Examiner* — Brook Kebede
(74) *Attorney, Agent, or Firm* — Servilla Whitney LLC

(57) ABSTRACT

Methods and precursors for selectively depositing a metal film on a silicon nitride surface relative to a silicon oxide surface are described. The substrate comprising both surfaces is exposed to a blocking compound to selectively block the silicon oxide surface. A metal film is then selectively deposited on the silicon nitride surface.

20 Claims, 2 Drawing Sheets

(51) Int. Cl.
*C23C 16/34* (2006.01)
*C23C 16/40* (2006.01)

(52) U.S. Cl.
CPC .. *H01L 21/02181* (2013.01); *H01L 21/02183* (2013.01); *H01L 21/02186* (2013.01); *H01L 21/02189* (2013.01); *H01L 21/02205* (2013.01)

(58) Field of Classification Search
CPC ........... H01L 21/02205; H01L 21/0228; C23C 16/04; C23C 16/34; C23C 16/40; C23C 16/45534
See application file for complete search history.

(56) References Cited

U.S. PATENT DOCUMENTS

| | | |
|---|---|---|
| 2007/0098902 A1 | 5/2007 | Engstrom et al. |
| 2010/0136776 A1 | 6/2010 | Huotari et al. |
| 2013/0243956 A1 | 9/2013 | Ma |
| 2015/0099072 A1 | 4/2015 | Takamure et al. |
| 2016/0322213 A1* | 11/2016 | Thompson ............ C23C 16/455 |

* cited by examiner

METHODS AND PRECURSORS FOR SELECTIVE DEPOSITION OF METAL FILMS

CROSS-REFERENCE TO RELATED APPLICATIONS

This application is the National Stage entry of PCT/US2018/054736, filed on Oct. 5, 2018, which claims priority to U.S. Provisional Application Ser. No. 62/569,240, filed Oct. 6, 2017, the entire disclosures of which are hereby incorporated by reference herein.

FIELD

Embodiments of the disclosure relate to methods for selectively depositing metal films. More particularly, embodiments of the disclosure are directed to methods selectively depositing metal films on silicon nitride and not on silicon dioxide.

BACKGROUND

The semiconductor industry faces many challenges in the pursuit of device miniaturization which involves rapid scaling of nanoscale features. Such issues include the introduction of complex device fabrication processes with multiple lithography steps and etch. Furthermore, the semiconductor industry would like low cost alternatives to high cost EUV for patterning complex architectures. To maintain the cadence of device miniaturization and keep chip manufacturing costs down, selective deposition has shown promise as it has the potential to remove costly lithographic steps by simplifying integration schemes.

Selective deposition of materials can be accomplished in a variety of ways. For instance, some process may have inherent selectivity to surfaces just based on their surface chemistry. These processes are fairly rare and usually need to have surfaces with drastically different surface energies, such as metals and dielectrics. In the cases where surfaces are similar ($SiO_2$ versus SiN) the surfaces need to be selectively blocked by employing surface treatments that selectively react with one surface and not the other, effectively blocking any surface reactions during a subsequent deposition process.

Selective-area atomic layer deposition (SA-ALD) can be used to deposit selectively only on certain materials while not on others. In some embodiments, the surfaces on which deposition is not achieved are blocked by a chemical inhibitor or surface treatment. Yet, some deposition precursors are not effectively blocked by current technologies.

Therefore, there is an ongoing need in the art for methods and materials to inhibit deposition on certain surfaces while selectively depositing metal-containing films on other surfaces.

SUMMARY

One or more embodiments of the disclosure are directed to methods of selectively depositing a metal film. The methods comprise exposing a substrate with a first surface comprising $SiO_2$ and a second surface comprising $Si_xN_y$ to a blocking precursor to form a blocked first surface. The blocking precursor comprises a compound of the formula $R_3Si-X$, where each R is independently C1-C4 alkyl and X is a reactive handle. The substrate is exposed to a metal precursor. The metal precursor comprises a compound of the formula $M(NR'_2)_a$ where each R' is independently C1-C4 alkyl and is greater than or equal to one. The substrate is exposed to a reagent to react with the metal precursor to form a metal film on the second layer.

Additional embodiments of the disclosure are directed to methods of selectively depositing a titanium nitride film. The methods comprise exposing a substrate with a first surface comprising $SiO_2$ and a second surface comprising $Si_xN_y$ to a blocking precursor to form a blocked first surface. The blocking precursor comprises trimethylsilylpyrrolidine. The substrate is exposed to a metal precursor to deposit a layer of metal species on the second surface. The metal precursor comprises TDEAT. The substrate is exposed to ammonia to react with the layer of metal species on the second layer to form a titanium nitride film.

Further embodiments of the disclosure are directed to methods of selectively depositing a hafnium oxide film. The methods comprise exposing a substrate with a first surface comprising $SiO_2$ and a second surface comprising $Si_xN_y$ to a blocking precursor to form a blocked first surface. The blocking precursor comprises trimethylsilylpyrrolidine. The substrate is exposed to a metal precursor to deposit a layer of metal species on the second surface. The metal precursor comprises PDMAH. The substrate is exposed to water to react with the layer of metal species on the second layer to form a hafnium oxide film.

BRIEF DESCRIPTION OF THE DRAWING

So that the manner in which the above recited features of the disclosure can be understood in detail, a more particular description of the disclosure, briefly summarized above, may be had by reference to embodiments, some of which are illustrated in the appended drawing. It is to be noted, however, that the appended drawing illustrates only typical embodiments of the disclosure and is therefore not to be considered limiting of its scope, for the disclosure may admit to other equally effective embodiments.

DETAILED DESCRIPTION

Figure 1:
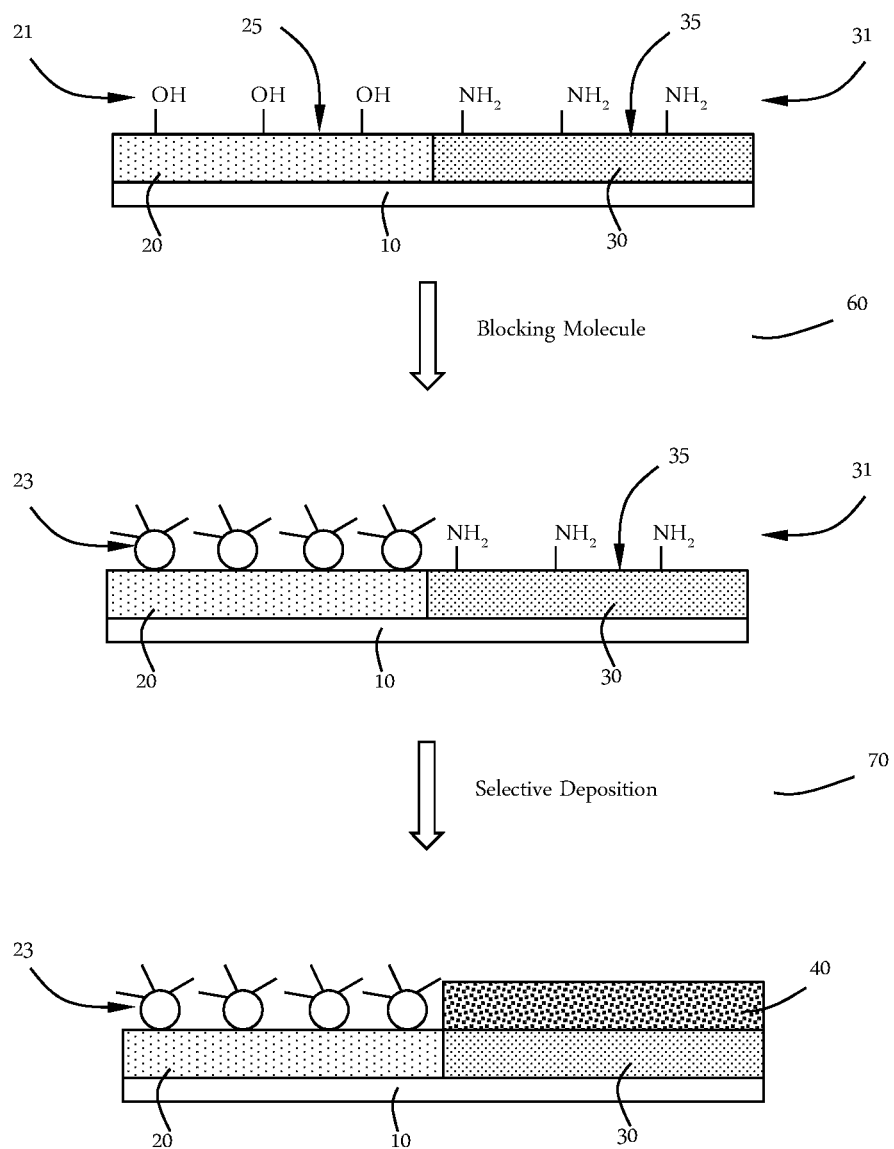
FIG. 1 illustrates a selective deposition process in accordance with one or more embodiment of the disclosure.

Embodiments of the disclosure provide methods and materials for selectively depositing metal films on silicon nitride surfaces over silicon oxide surfaces. The process of various embodiments uses atomic layer deposition (ALD) to provide metal films on portions of a substrate.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" as used herein refers to the sequential exposure to a substrate of two or more deposition gases to deposit a layer of material on a substrate surface. As used in this specification and the appended claims, the terms "reactive compound", "reactive gas", "reactive species", "precursor", "process gas", :deposition gas" and the like are used interchangeably to mean a substance with a species capable of reacting with the substrate surface or material on the substrate surface in a chemical reaction (e.g., substitution, elimination, addition, oxidation, reduction). The substrate, or portion of the substrate, is exposed sequentially to the two or more reactive compounds which are introduced into a reaction zone of a processing chamber. In a time-domain process, exposure to each reactive compound is separated by a time delay to allow each compound to react with the substrate surface and then be purged from the processing chamber. In a spatial process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired molecular layer or layer thickness is formed on the substrate surface. In either scenario, the process of pulsing compound A, purge gas, compound B and purge gas is a cycle. A cycle can start with either compound A or compound B and continue the respective order of the cycle until achieving a film with the predetermined thickness.

In an embodiment of a spatial process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas, although not simultaneously.

One or more embodiments of the disclosure advantageously provide methods of selectively depositing a metal film on a $Si_xN_y$ surface with substantially no deposition on a silicon oxide ($SiO_2$) surface. In some embodiments, the selective deposition is advantageously accomplished by combining a selective surface blocking step utilizing a blocking molecule that selectively reacts with an $SiO_2$ surface to form a blocked surface. Deposition proceeds on other substrate surfaces which remain unblocked.

A general surface mechanism of one or more embodiment of the disclosure can be carried out to block $SiO_2$ surfaces and subsequently stop or minimize deposition of metal films thereon while depositing these metal films on $Si_xN_y$. Without being bound by any particular theory of operation, it is believed that the blocking molecules described herein, when used with the metal precursors described herein prevent the reaction of the metal precursors with the $SiO_2$ surface.

In some embodiments, the $SiO_2$ surface groups can be reacted with blocking molecules that have reactivity with Si—OH and not Si—$NH_2$. These molecules can be introduced to the substrates via vapor phase delivery, in solution form or in neat form. After selective surface blocking, ALD or CVD processes can be employed to grow metal films selectively on the silicon nitride surface.

With reference to FIG. 1, one or more embodiments of the disclosure are directed to a method of selectively depositing a film. The method comprises providing a substrate 10 comprising a first material 20 and a second material 30. As used in this manner, the term "providing a substrate" means that the substrate is placed into a position (e.g., within a processing chamber) for processing. The first material 20 has a first surface 25 with hydroxide terminations 21. The second material 30 has a second surface 35 with amine terminations 31.

In some embodiments, the first surface 25 comprises silicon oxide ($SiO_2$). In some embodiments, the first surface 25 consists essentially of silicon oxide. As used in this specification and the appended claims, a material that "consists essentially of" a stated composition means that greater than or equal to about 95%, 98% or 99% of the material is the stated composition.

In some embodiments, the second surface 35 comprises $Si_xN_y$. In some embodiments, the second surface 35 consists essentially of $Si_xN_y$. As used in this regard, $Si_xN_y$ is any suitable material comprising silicon and nitrogen. In some embodiments, the second surface 35 consists essentially of silicon and nitrogen. In general, these materials may include silicon nitrides. In some embodiments, the material of the second surface 35 is a stoichiometric silicon nitride. In some embodiments, the ratio of silicon to nitrogen in the second surface 35 is about 3:4. In some embodiments, the ratio of silicon to nitrogen atoms is a non-stoichiometric ratio. In some embodiments, the ratio of silicon to nitrogen in the second surface 35 is less than 3:4. In some embodiments, the ratio of silicon to nitrogen in the second surface 35 is greater than 3:4.

The substrate 10, and the first surface 25 and second surface 35, is exposed to a blocking precursor 60. The blocking precursor can be any suitable compound that can react with the hydroxide terminated 21 surface and not the amine terminated 31 surface. The blocking precursor 60 reacts with the hydroxide terminated 21 surface to form a blocked first surface 23 on the first material 20.

In some embodiments, the blocking precursor 60 comprises a compound of the general formula $R_3Si—X$, where each R is independently an alkyl group and X is a reactive handle. In some embodiments, each R is independently a C1-4 alkyl group. As used in this regard C1-C4 alkyl means saturated carbon chains with 1-4 carbon atoms. In some embodiments, these carbon chains are linear. In some embodiments, these carbon chains are branched. In some embodiments, each R is methyl. In some embodiments, X is selected from halide, azide, amino, hydrazide, cyanide or isocyanate groups. In some embodiments, X comprises a primary, secondary or tertiary amine with linear C1-6 alkyl or branched C1-4 alkyl groups. In some embodiments, X is a cyclic amine with an up to 6-membered ring. In some embodiments, X comprises a cyclic pyrrolyl group (—N($CH_2$)$_4$). In some embodiments, the blocking precursor 60 comprises trimethylsilylpyrrolidine ($CH_3$)$_3$SiN($CH_2$)$_4$. In some embodiments, the blocking precursor 60 consists essentially of trimethylsilylpyrrolidine. As used in this manner, the term "consists essentially of" means that the reactive component of the blocking precursor (not including inert, diluent or carrier species) is greater than or equal to about 95%, 98% or 99% of the stated species, on a molar basis.

After formation of the blocked first surface 23, a selective deposition 70 of a metal film 40 on the second material 30 can be performed. The metal film 40 can be deposited by any suitable deposition technique known to the skilled artisan. Suitable techniques include, but are not limited to, chemical vapor deposition, atomic layer deposition or physical vapor deposition.

The substrate 10, and the blocked first surface 23 and second surface 35, is exposed to a metal precursor. In some embodiments, the metal precursor chemisorbs onto the second surface 35 to deposit a layer of metal species on the second surface 35. In these embodiments, the layer of metal species on the second surface reacts with a reagent to form a metal film 40. In some embodiments, the metal precursor and the reagent are present at the same time and react to form a metal film 40 on the second surface 35. In some embodiments, the blocking precursor 60, the metal precursor and the reagent are each exposed to the substrate 10 separately. In some embodiments, the metal precursor and the reagent are exposed to the substrate 10 simultaneously. Some embodiments deposit the metal film 40 through a time-domain ALD process. Some embodiments deposit the metal film 40 through a spatial ALD process.

The metal film is a general term used to described metal-containing materials. In some embodiments, the metal film is a pure metal film. As used in this regard, "a pure metal film" means that metal atoms are greater than or equal to about 98%, 99% or 99.5% of the metal film, on an atomic basis. In some embodiments, the metal film comprises other atoms. In some embodiments, the metal film comprises one or more of oxygen, nitrogen, carbon, silicon, boron or germanium.

The metal precursor can be any suitable compound that can react with the reagent to form a metal film 40. In some embodiments, the metal precursor comprises a compound of the formula M(NR'$_2$)$_a$ where each R' is independently C1-C4 alkyl and a is greater than or equal to one. As used in this regard C1-C4 alkyl means saturated carbon chains with 1-4 carbon atoms. In some embodiments, these carbon chains are linear. In some embodiments, these carbon chains are branched. Compounds of the general formula above may also contain other ligands as long as a is greater than or equal to one. In some embodiments, the metal precursor does not contain any metal halides. In some embodiments, the film comprises titanium and the metal precursor does not contain any $TiCl_4$.

Without being bound by theory, it is believed that the amino metal complexes disclosed herein are much larger than related metal halides. Accordingly, the blocking precursor 60 disclosed herein, after reacting with the first surface 25, is effective to block the amino metal complexes but not the metal halides from reacting with the first surface 25. In so doing, the disclosed methods provide for selective deposition on the second surface 35 which remains unblocked by the blocking precursor 60.

Without being bound by theory, it is also believed that the amino metal complexes disclosed herein possess larger steric hindrances than related metal halides. Therefore the amino metal complexes have a higher energy barrier when reacting with the blocked first surface 23 than when reacting with the second surface 35. Accordingly, the reaction of the metal precursor with the second surface 35 is thermodynamically favorable over reaction with the blocked first surface 23.

The metal of the metal precursor can be any suitable metal. In some embodiments, the metal of the metal precursor is selected from Ti, Zr, Hf, or Ta. In some embodiments, the metal precursor consists essentially of compounds which contain Ti. In some embodiments, the metal precursor consists essentially of compounds which contain Zr. In some embodiments, the metal precursor consists essentially of compounds which contain Hf. In some embodiments, the metal precursor consists essentially of compounds which contain Ta.

In some embodiments, each R' is methyl. In some embodiments, each R' is ethyl. In some embodiments, the R' groups within a single ligand are identical (e.g. N($CH_3$)$_2$). In some embodiments, the R' groups within a single ligand are different (e.g. N($CH_3$)($C_2H_5$)).

In some embodiments, a is greater than or equal to 4. In some embodiments, the metal precursor consists essentially of Ti(N($CH_3$)$_2$)$_4$ (TDMAT). In some embodiments, the metal precursor consists essentially of Ti(N($C_2H_5$)$_2$)$_4$ (TDEAT). In some embodiments, the metal precursor consists essentially of Hf(N($CH_3$)$_2$)$_5$ (PDMAH). As used in this manner, the term "consists essentially of" means that the reactive component of the metal precursor (not including inert, diluent or carrier species) is greater than or equal to about 95%, 98% or 99% of the stated species, on a molar basis.

The reagent can be any suitable compound that can react with the metal precursor to form a metal film 40. Suitable reactants may include, but are not limited to, hydrogen, ammonia, hydrazine, hydrazine derivatives and other co-reactants to make metal or metal nitride films. Suitable reactants may also include, but are not limited to, oxygen, ozone, water and other oxygen based reagents to make metal or metal oxide films. In some embodiments, plasmas of a reagent are used to form the metal film 40. In some embodiments, the reagent comprises one or more of hydrogen, ammonia or water.

In some embodiments, the reagent consists essentially of ammonia and the metal film is a metal nitride film. In some embodiments, the reagent consists essentially of water and the metal film is a metal oxide film. As used in this manner, the term "consists essentially of" means that the stated component of the reagent (not including inert, diluent or carrier species) is greater than or equal to about 95%, 98% or 99% of the reagent, on a molar basis. As used in this regard, a metal nitride film is any film comprising metal and nitrogen atoms. As used in this regard, a metal oxide film is any film comprising metal and oxygen atoms. Films which comprise atoms other than metal (e.g. metal nitrides or metal oxides) may or may not be comprised of atoms in a stoichiometric ratio.

After formation of the metal film 40, the blocked first surface 23 can be left on the first material 20 or removed. Since the blocked first surface 23 is basically one monolayer of material, it may not interfere with further processing, depending on the process conditions and subsequent films being deposited. In some embodiments, the blocked first surface 23 is removed prior to further processing. The blocked first surface 23 can be removed by any suitable technique that can remove the blocked first surface 23 without substantially damaging the metal film 40 deposited on the second material 30. Suitable techniques include, but are not limited to, oxidation or etching. Oxidation can be by exposure to an oxidizer (e.g., oxygen plasma, ozone, high temperature oxygen anneal, peroxide or water).

The methods described herein may be conducted at any suitable temperature. In some embodiments, the substrate is maintained at a temperature in the range of about 150° C. to about 450° C., about 200° C. to about 400° C., about 250° C. to about 375° C., about 225° C. to about 350° C., or about 250° C. to about 350° C. In some embodiments, the substrate is maintained at a temperature less than or equal to about 450° C., less than or equal to about 400° C., less than or equal to about 375° C., less than or equal to about 350° C., less than or equal to about 300° C., or less than or equal to about 250° C. In some embodiments, the substrate is maintained at a temperature greater than or equal to about 150° C., greater than or equal to about 200° C., greater than or equal to about 225° C., greater than or equal to about 250° C., greater than or equal to about 300° C., or greater than or equal to about 350° C.

Figure 2:
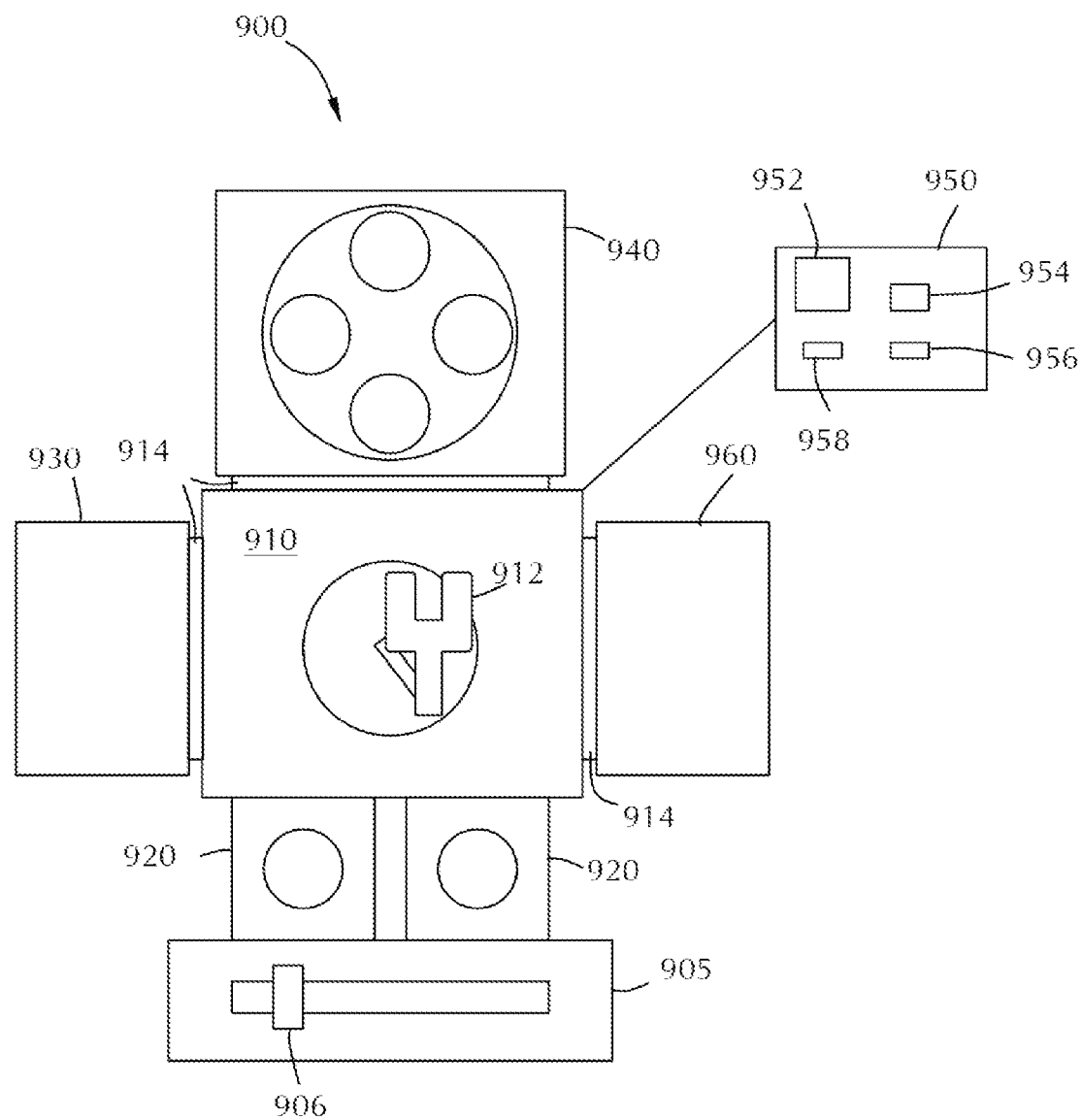
FIG. 2 illustrates an exemplary system for processing a substrate according to one or more embodiment of the disclosure.

With reference to FIG. 2, additional embodiments of the disclosure are directed to processing system 900 for executing the methods described herein. FIG. 2 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 2, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a blocking layer deposition chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises a selective deposition chamber and is fluid communication with one or more reactive gas sources to provide flows of reactive gas to the processing chamber 940 to perform the isotropic etch process. The substrate can be moved to and from the processing chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as a blocking layer deposition chamber. In some embodiments, the processing chamber 930 and processing chamber 960 can be configured to perform the deposition processes on two substrates at the same time and processing chamber 940 and processing chamber 945 can be configured to perform the selective deposition processes.

In some embodiments, each of the processing chambers 930, 940, 945 and 960 are configured to perform different portions of the processing method. For example, processing chamber 930 may be configured to perform the blocking layer deposition process, processing chamber 940 may be configured to perform the selective deposition process, processing chamber 945 may be configured as a metrology station or to perform a first selective epitaxial growth process and processing chamber 960 may be configured to perform a second epitaxial growth process. The skilled artisan will recognize that the number and arrangement of individual processing chambers on the tool can be varied and that the embodiment illustrated in FIG. 2 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows for measurement of the substrate, typically without exposing the substrate to an oxidizing environment.

At least one controller 950 is coupled to one or more of the central transfer station 910, the pre-clean/buffer chamber 920, processing chambers 930, 940, 945, or 960. In some embodiments, there is more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to deposit a blocking layer on the first surface of a substrate; and a configuration to form a metal film on the second surface of a substrate.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a metal film, the method comprising:
    exposing a substrate with a first surface comprising $SiO_2$ and a second surface comprising silicon nitride to a blocking precursor to form a blocked first surface, the blocking precursor comprising a compound of the formula $R_3Si$—$X$, where each R is independently C1-C4 alkyl and X is a reactive handle;
    exposing the substrate to a metal precursor, the metal precursor comprising a compound of the formula $M(NR'_2)_a$ where each R' is independently C1-C4 alkyl and a is greater than or equal to one; and
    exposing the substrate to a reagent to react with the metal precursor to form a metal film on the second surface.

2. The method of claim 1, wherein each exposure occurs separately.

3. The method of claim 1, wherein each R is methyl.

4. The method of claim 1, wherein X is selected from halide, azide, amino, hydrazide, cyanide or isocyanate groups.

5. The method of claim 4, wherein X comprises a primary, secondary or tertiary amine with linear C1-6 alkyl or branched C1-4 alkyl groups.

6. The method of claim 4, wherein X is a pyrrolyl group.

7. The method of claim 1, wherein the blocking precursor consists essentially of trimethylsilylpyrrolidine.

8. The method of claim 1, wherein the metal precursor comprises one or more of Ti, Zr, Hf, or Ta.

9. The method of claim 1, wherein the metal precursor does not contain any metal halides.

10. The method of claim 1, wherein each R' is methyl.

11. The method of claim 1, wherein each R' is ethyl.

12. The method of claim 1, wherein a is greater than or equal to 4.

13. The method of claim 1, wherein the metal precursor consists essentially of $Ti(N(CH_3)_2)_4$ (TDMAT).

14. The method of claim 1, wherein the metal precursor consists essentially of $Ti(N(C_2H_5)_2)_4$ (TDEAT).

15. The method of claim 1, wherein the reagent comprises one or more of hydrogen, ammonia or water.

16. The method of claim 15, wherein the reagent consists essentially of ammonia and the metal film is a metal nitride film.

17. The method of claim 15, wherein the reagent consists essentially of water and the metal film is a metal oxide film.

18. The method of claim 1, wherein the substrate is maintained at a temperature in the range of about 200° C. to about 400° C.

19. A method of selectively depositing a titanium nitride film, the method comprising:
    exposing a substrate with a first surface comprising $SiO_2$ and a second surface comprising silicon nitride to a blocking precursor to form a blocked first surface, the blocking precursor comprising trimethylsilylpyrrolidine;
    exposing the substrate to a metal precursor to deposit a layer of metal species on the second surface, the metal precursor comprising TDEAT; and
    exposing the substrate to ammonia to react with the layer of metal species on the second surface to form a titanium nitride film.

20. A method of selectively depositing a hafnium oxide film, the method comprising:
    exposing a substrate with a first surface comprising $SiO_2$ and a second surface comprising silicon nitride to a blocking precursor to form a blocked first surface, the blocking precursor comprising trimethylsilylpyrrolidine;
    exposing the substrate to a metal precursor to deposit a layer of metal species on the second surface, the metal precursor comprising PDMAH; and
    exposing the substrate to water to react with the layer of metal species on the second surface to form a hafnium oxide film.

* * * * *